United States Patent
Ando et al.

(10) Patent No.: US 9,302,395 B2
(45) Date of Patent: Apr. 5, 2016

(54) CONVEYING ROBOT

(75) Inventors: Ryuji Ando, Fukuoka (JP); Kazunori Hino, Fukuoka (JP); Akihiro Furutani, Fukuoka (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 778 days.

(21) Appl. No.: 13/609,254

(22) Filed: Sep. 11, 2012

(65) Prior Publication Data

US 2013/0195591 A1    Aug. 1, 2013

(30) Foreign Application Priority Data

Jan. 26, 2012  (JP) ................................. 2012-014388

(51) Int. Cl.
| | |
|---|---|
| *B25J 19/06* | (2006.01) |
| *B25J 11/00* | (2006.01) |
| *B25J 9/04* | (2006.01) |
| *H01L 21/677* | (2006.01) |
| *H01L 21/687* | (2006.01) |

(52) U.S. Cl.
CPC .............. *B25J 11/0095* (2013.01); *B25J 9/042* (2013.01); *H01L 21/67742* (2013.01); *H01L 21/68707* (2013.01); *Y10S 414/141* (2013.01); *Y10S 901/49* (2013.01)

(58) Field of Classification Search
CPC .................................................... B25J 11/0095
USPC ....................................................... 414/744.5
See application file for complete search history.

(56) References Cited

U.S. PATENT DOCUMENTS

| | | | |
|---|---|---|---|
| 8,016,542 B2* | 9/2011 | Cox .................. | H01L 21/67742 414/744.5 |
| 8,366,375 B2* | 2/2013 | Musha ................... | B25J 9/1065 414/744.5 |
| 8,672,604 B2* | 3/2014 | Kubota .................... | B25J 9/101 414/744.3 |
| 2003/0035711 A1 | 2/2003 | Gilchrist | |

FOREIGN PATENT DOCUMENTS

| | | |
|---|---|---|
| JP | 11-251400 | 9/1999 |
| JP | 2004-535681 | 11/2004 |
| JP | 2007-005582 | 1/2007 |
| JP | 2011-105151 | 6/2011 |
| JP | 2011-110682 | 6/2011 |
| KR | 10-2009-0102258 | 9/2009 |
| TW | 201026459 | 7/2010 |

OTHER PUBLICATIONS

Japanese Office Action for corresponding JP Application No. 2012-014388, Jan. 7, 2014.
Taiwanese Office Action for corresponding TW Application No. 101134287, Feb. 12, 2015.

(Continued)

*Primary Examiner* — Scott Lowe
(74) *Attorney, Agent, or Firm* — Mori & Ward, LLP

(57) ABSTRACT

A robot system according to an aspect of the embodiments includes a plurality of work holding units and a heat insulating member. The work holding units each hold a work to be conveyed on one surface and are arranged vertically one over another in some cases during conveying of the work. The heat insulating member is provided on another surface side of at least one of the work holding units.

12 Claims, 6 Drawing Sheets

(56) References Cited

OTHER PUBLICATIONS

Korean Office Action for corresponding KR Application No. 10-2012-0127100, Jul. 11, 2014.

Chinese Office Action for corresponding CN Application No. 201210432346.X, Oct. 24, 2014.
Chinese Office Action for corresponding CN Application No. 201210432346.X, Jun. 25, 2015.

* cited by examiner

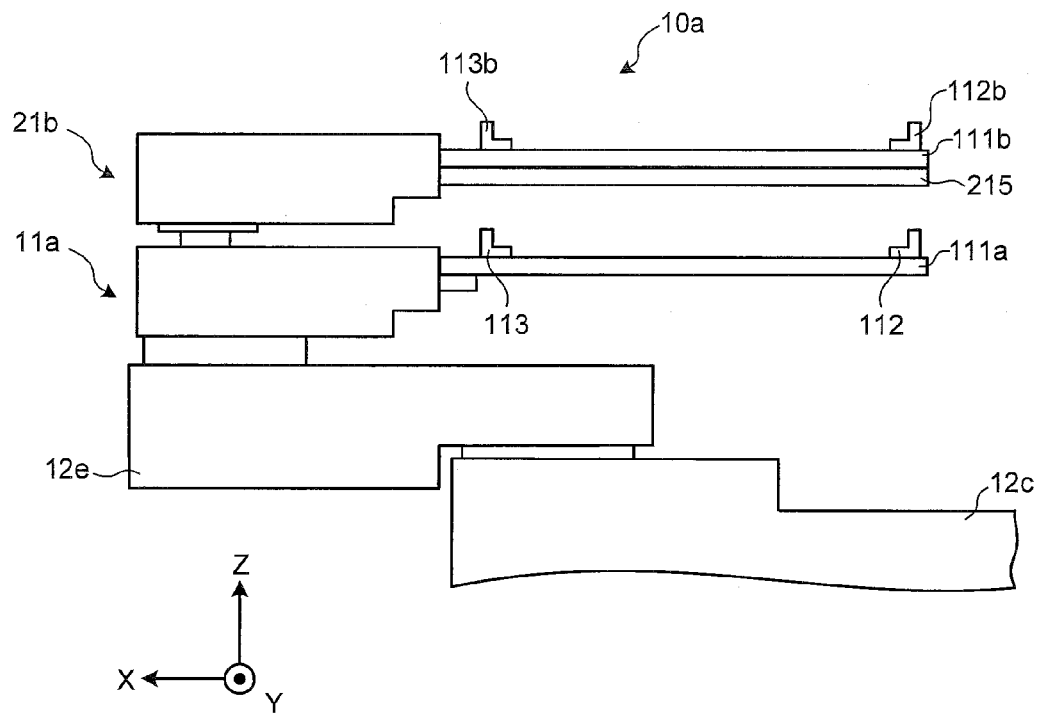
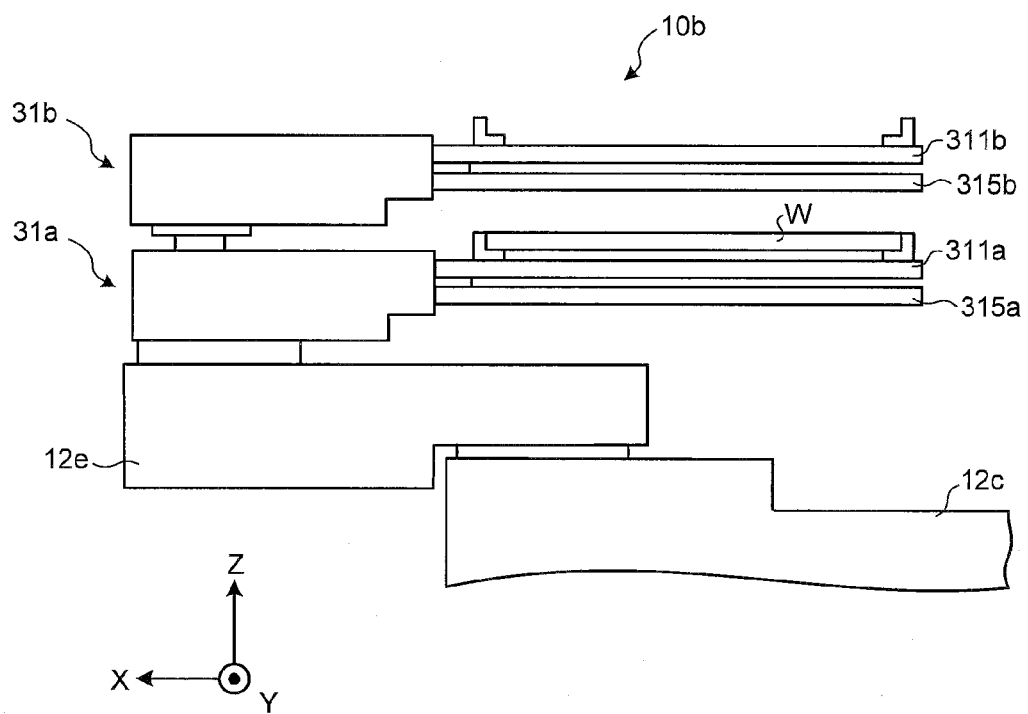

CONVEYING ROBOT

CROSS-REFERENCE TO RELATED APPLICATION

This application is based upon and claims the benefit of priority of the prior Japanese Patent Application No. 2012-014388, filed on Jan. 26, 2012, the entire contents of which are incorporated herein by reference.

FIELD

The embodiments discussed herein are directed to a conveying robot.

BACKGROUND

Conventionally, there is known a conveying robot that conveys a substrate, such as a wafer, into or out of a processing apparatus in a semiconductor manufacturing process in a space formed in a local cleaning apparatus called an EFEM (Equipment Front End Module).

A conveying robot that conveys a substrate generally includes an arm provided with a holding unit, which holds a substrate, at the tip thereof and conveys a substrate by operating the arm and the holding unit in a horizontal direction while holding the substrate, for example, by placing it on the upper surface of the holding unit.

Examples of such a conveying robot include one that includes a plurality of holding units and conveys a plurality of substrates in parallel by individually operating the holding units on the planes parallel to each other (for example, see Japanese Patent Laid-open Publication 2007-005582).

A semiconductor manufacturing process includes processing of heating a substrate, such as baking processing. Therefore, the conveying robot that includes a plurality of holding units in some cases needs to perform an operation of conveying a room-temperature substrate before the processing by another holding unit in parallel with an operation of conveying a high-temperature substrate after the processing by a holding unit.

However, in the conventional conveying robot including a plurality of holding units, another holding unit is adversely affected in some cases by the radiation heat radiated from the holding unit during conveying of the high-temperature substrate or the radiation heat radiated from a heated substrate during conveying.

For example, when a holding unit conveying a high-temperature substrate and a holding unit conveying a room-temperature substrate are brought into a positional relationship in which they are vertically close to each other, the holding unit conveying the room-temperature substrate may be adversely affected by the radiation heat radiated from the holding unit conveying the high-temperature substrate or the radiation heat radiated from the heated substrate during conveying.

SUMMARY

A robot system according to an aspect of the embodiments includes a plurality of work holding units and a heat insulating member. The work holding units each hold a work to be conveyed on one surface and are arranged vertically one over another in some cases during conveying of the work. The heat insulating member is provided on another surface side of at least one of the work holding units.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 7 is a schematic side view of a conveying robot that includes a heat insulating member other than the heat insulating plate according to the first embodiment;

FIG. 8 is a schematic side view of a conveying robot that is provided with a hand for high temperature on a lower stage side and a hand for low temperature on an upper stage side according to the first embodiment.

DESCRIPTION OF EMBODIMENTS

Hereinafter, embodiments of a conveying system including a conveying robot disclosed in the present application will be explained in detail with reference to the accompanying drawings. This invention is not limited to the following embodiments.

In the following, an explanation is given of a case where a work that is an object to be conveyed is a substrate and the substrate is a semiconductor wafer, and the "semiconductor wafer" is described as a "wafer". Moreover, a "robot hand", which is an end effector, is described as a "hand".

First Embodiment

Figure 1:
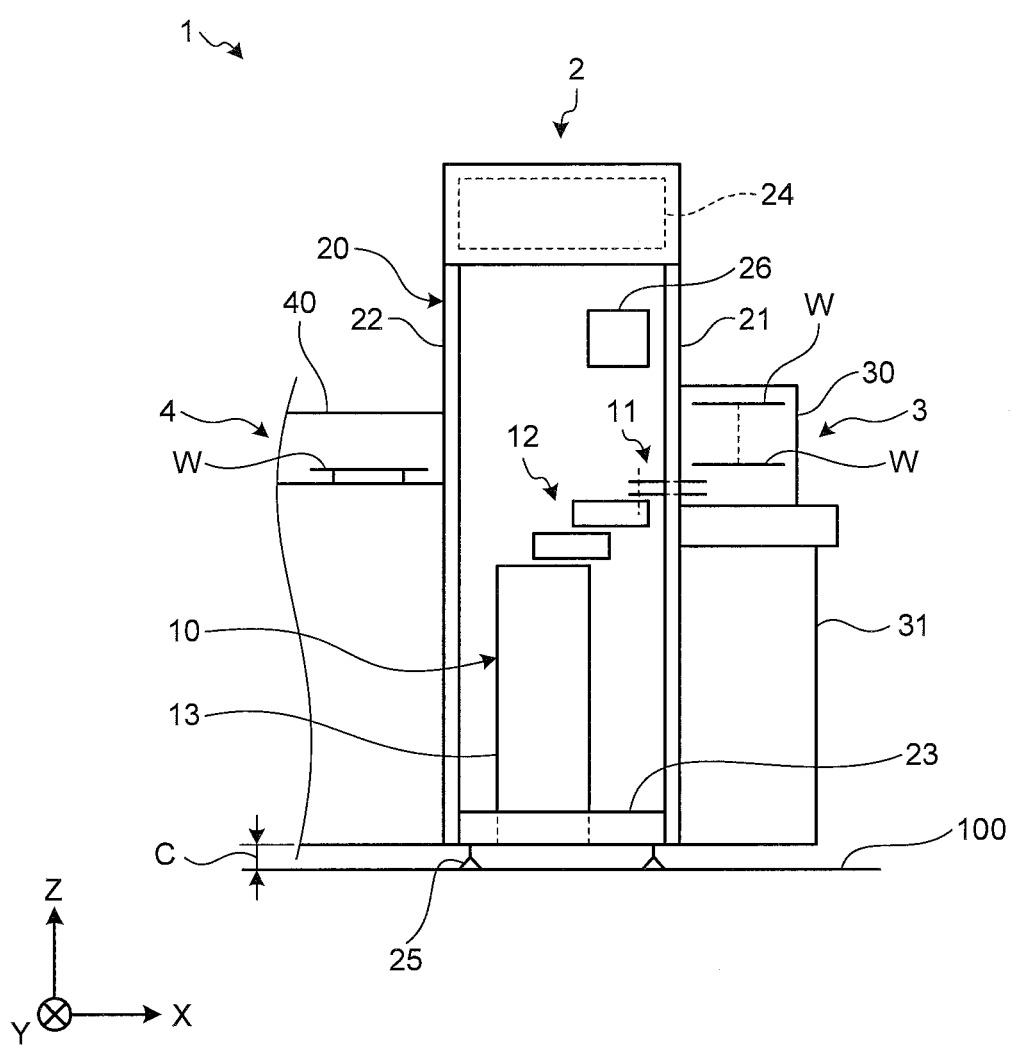
FIG. 1 is a schematic diagram illustrating the entire configuration of a conveying system according to a first embodiment.

First, the entire configuration of a conveying system according to the first embodiment will be explained with reference to FIG. 1. FIG. 1 is a schematic diagram illustrating the entire configuration of a conveying system 1 according to the first embodiment.

For ease of understanding, in FIG. 1, a three-dimensional Cartesian coordinate system that includes a Z axis, in which a positive direction is vertically upward and a negative direction is vertically downward (that is, "vertical direction"), is illustrated. Therefore, the direction along an XY plane indicates a "horizontal direction". The Cartesian coordinate system is shown in some cases in other drawings that are used for the following explanation. Moreover, in the following, for a component composed of a plurality of elements, only one of the elements is denoted by a reference numeral and reference numerals of other elements are omitted in some cases.

As shown in FIG. 1, the conveying system 1 according to the first embodiment includes a substrate conveying unit 2, a substrate supplying unit 3, and a substrate processing unit 4. The substrate conveying unit 2 includes a conveying robot 10 and a casing 20 that accommodates the conveying robot 10. The substrate supplying unit 3 is provided on one side surface 21 of the casing 20 and the substrate processing unit 4 is provided on the other side surface 22. The conveying system 1 includes a mounting surface 100.

The conveying robot 10 includes an arm unit 12 that includes a work holding unit (hereinafter, described as a "hand") 11 that can hold a wafer W as an object to be conveyed at upper and lower two stages. The arm unit 12 is supported to be raisable and lowerable and moreover pivotable in the horizontal direction with respect to a base 13 arranged on a base mounting frame 23 that forms a bottom wall portion of the casing 20. The conveying robot 10 will be described in detail below with reference to FIG. 2.

The casing 20 is what is called an EFEM and creates a downflow of clean air by a filter unit 24 provided in the upper portion. The inside of the casing 20 is maintained in a high cleanliness state by the downflow. Leg parts 25 are provided on the lower surface of the base mounting frame 23 and support the casing 20 in a state where a predetermined clearance C is provided between the casing 20 and the mounting surface 100.

The substrate supplying unit 3 includes a FOUP 30 that stores a plurality of the wafers W in multiple stages in a height direction and a FOUP opener (not shown) that opens and closes the lid of the FOUP 30 to enable the wafer W to be removed and conveyed into the casing 20. A plurality of sets of the FOUP 30 and the FOUP opener can be arranged in parallel at predetermined intervals on a table 31 having a predetermined height.

The substrate processing unit 4 is, for example, a processing unit that performs predetermined processing in a semiconductor manufacturing process, such as cleansing processing, film deposition processing, and photolithography processing, on the wafer W. The substrate processing unit 4 includes a processing apparatus 40 that performs the predetermined processing. The processing apparatus 40 is arranged on the other side surface 22 of the casing 20 to be opposed to the substrate supplying unit 3 with the conveying robot 10 therebetween.

Moreover, a prealignment apparatus 26 that performs centering and notch alignment of the wafer W is provided in the casing 20.

Then, the conveying system 1 according to the first embodiment causes the conveying robot 10 to remove the wafer W in the FOUP 30 by performing a lifting operation and a pivoting operation and conveys the wafer W into the processing apparatus 40 via the prealignment apparatus 26 on the basis of the configuration. Then, the wafer W subjected to the predetermined processing in the processing apparatus 40 is conveyed out again and is conveyed to be accommodated into the FOUP 30 again by the operation of the conveying robot 10.

Figure 2:
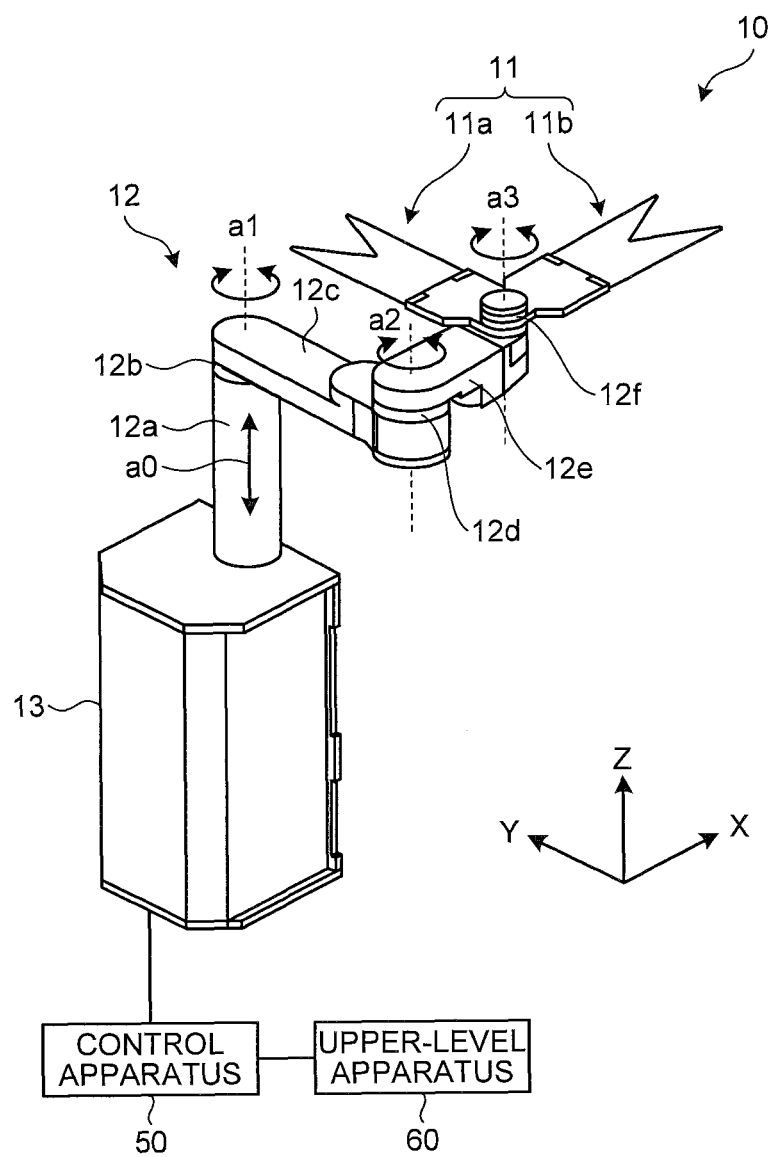
FIG. 2 is a schematic diagram illustrating the configuration of a conveying robot according to the first embodiment.

Next, the configuration of the conveying robot 10 according to the first embodiment will be explained with reference to FIG. 2. FIG. 2 is a schematic diagram illustrating the configuration of the conveying robot 10 according to the first embodiment.

As shown in FIG. 2, the conveying robot 10 according to the first embodiment includes the hand 11, the arm unit 12, and the base 13. The arm unit 12 includes a lifting unit 12a, a joint 12b, a joint 12d, a joint 12f, a first arm 12c, and a second arm 12e.

As described above, the base 13 is a base unit of the conveying robot 10 arranged on the base mounting frame 23 (see FIG. 1). The lifting unit 12a is provided to be slidable in the vertical direction (Z-axis direction) from the base 13 (see double-headed arrow a0 in FIG. 2) and raises and lowers the arm unit 12 in the vertical direction.

The joint 12b is a rotational joint about an axis a1 (see double-headed arrow about the axis a1 in FIG. 2). The first arm 12c is connected to the lifting unit 12a via the joint 12b to be rotatable with respect to the lifting unit 12a.

Moreover, the joint 12d is a rotational joint about an axis a2 (see double-headed arrow about the axis a2 in FIG. 2). The second arm 12e is connected to the first arm 12c via the joint 12d to be rotatable with respect to the first arm 12c.

Moreover, the joint 12f is a rotational joint about an axis a3 (see double-headed arrow about the axis a3 in FIG. 2). The hand 11 is connected to the second arm 12e via the joint 12f to be rotatable with respect to the second arm 12e.

Moreover, a not-shown drive mechanism, such as a motor, a pulley, and a belt, is provided in the lifting unit 12a, the first arm 12c, and the second arm 12e, and each of the joint 12b, the joint 12d, and the joint 12f rotates on the basis of the driving of the drive source.

Furthermore, various sensors that detect the operating state of the lifting unit 12a, the first arm 12c, and the second arm 12e are provided in the lifting unit 12a, the first arm 12c, and the second arm 12e.

The hand 11 is an end effector that holds the wafer W and includes two hands, i.e., a lower hand 11a and an upper hand 11b provided at different heights. The lower hand 11a and the upper hand 11b are provided adjacent to each other with the axis a3 as a common pivot and can pivot about the axis a3 independently of each other.

Then, in the conveying system 1 according to the first embodiment, the wafer W is placed on each of the lower hand 11a and the upper hand 11b and, for example, two wafers are conveyed by the conveying robot 10 at the same time, therefore, an improvement in work efficiency, an improvement in throughput, and the like can be achieved. The detailed configuration of the lower hand 11a and the upper hand 11b will be described later.

Moreover, various operations to be performed by the conveying robot 10 are controlled by a control apparatus 50. The control apparatus 50 is connected to the conveying robot 10 to be able to communicate with each other and is, for example, arranged beside the conveying robot 10 in the casing 20 (see FIG. 1), outside the casing 20, or the like. The conveying robot 10 and the control apparatus 50 may be integrated.

The operation control of various operations of the conveying robot 10 performed by the control apparatus 50 is performed based on teaching data stored in the control apparatus 50 in advance, however, in some cases, the control apparatus 50 obtains the teaching data from an upper-level apparatus 60 that is connected to the control apparatus 50 to be able to communicate with each other. Moreover, the upper-level apparatus 60 can sequentially monitor the state of the conveying robot 10 (and each component thereof).

In the present embodiment, for convenience' sake of explanation, the control apparatus 50 receives the teaching data and a notification of the state of the conveying robot 10 and the like from the upper-level apparatus 60. This point does not limit the distributed processing system in the conveying system 1.

Figure 3:
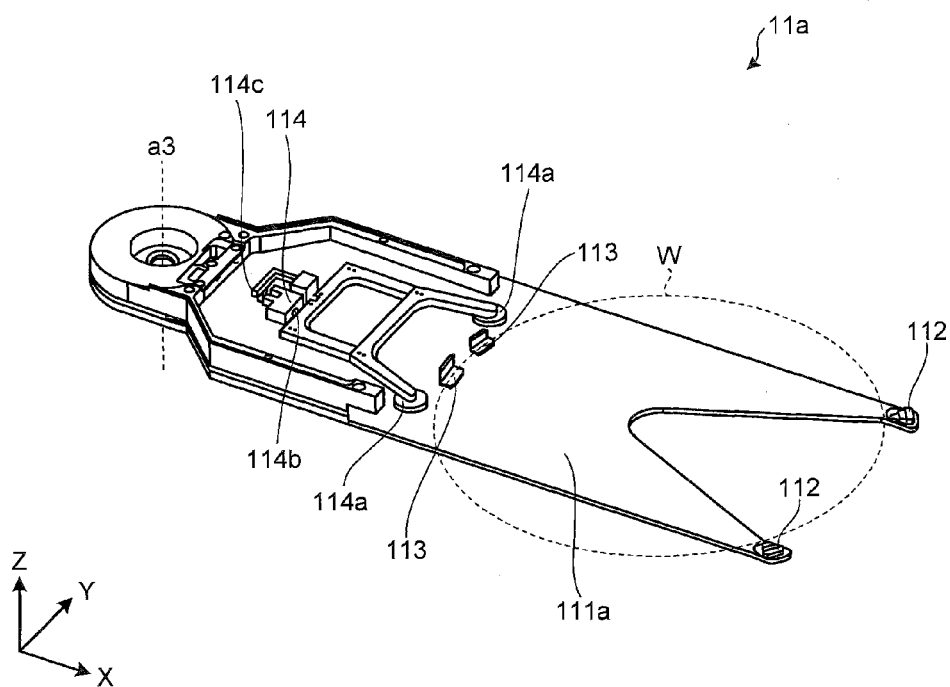
FIG. 3 is a schematic perspective view of a lower hand according to the first embodiment.
Figure 4:
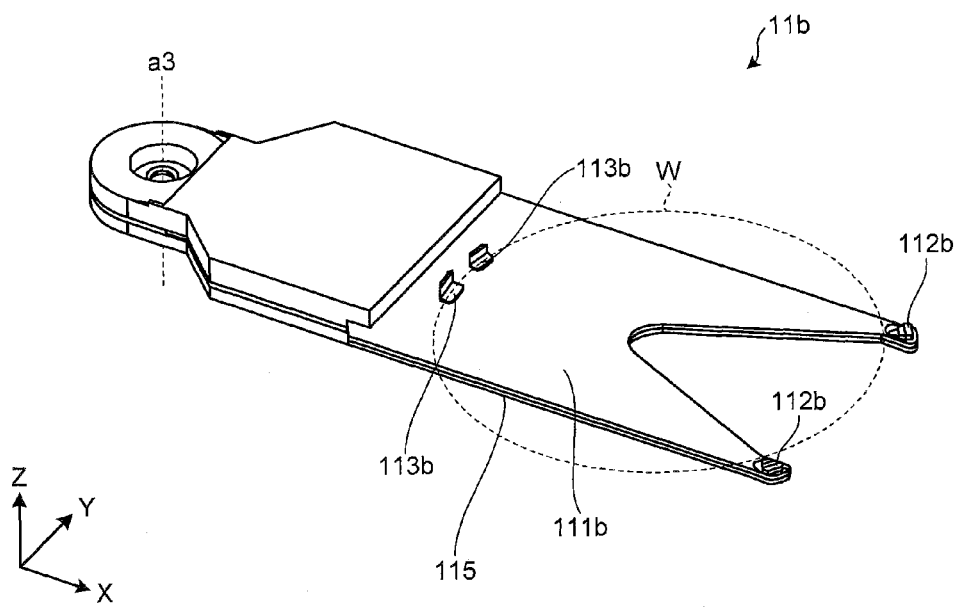
FIG. 4 is a schematic perspective view of an upper hand according to the first embodiment.

Next, the detailed configuration of the hand 11 according to the first embodiment will be explained with reference to FIG. 3 and FIG. 4. FIG. 3 is a schematic perspective view of the lower hand 11e according to the first embodiment, and FIG. 4 is a schematic perspective view of the upper hand 11b according to the first embodiment.

In this embodiment, an explanation is given of a case where the lower hand 11a is a room-temperature-work holding unit that holds and conveys a room-temperature wafer W and the upper hand 11b is a high-temperature-work holding unit that holds and conveys a high-temperature wafer W at a temperature above the room temperature.

As shown in FIG. 3, the lower hand 11a includes a plate 111, tip-side supporting units 112, base-end-side supporting units 113, a pressing driving unit 114, and pressing units 114a. The pressing driving unit 114 includes a projection 114b and a sensor 114c.

The plate 111 is a component corresponding to a base bottom portion or a base portion on which the wafer W is placed and is, for example, an aluminum plate body. FIG. 3 exemplifies the plate 111 whose tip side is V-shaped, however, the shape of the plate 111 is not limited to the one shown in FIG. 3.

The tip-side supporting units 112 are arranged at the tip portion of the plate 111. Moreover, the base-end-side supporting units 113 are arranged at the base end portion of the plate 111. FIG. 3 illustrates an example in which a pair of the tip-side supporting units 112 and a pair of the base-end-side supporting units 113 are arranged.

Then, as shown in FIG. 3, the wafer W is placed between the tip-side supporting units 112 and the base-end-side supporting units 113. At this time, the tip-side supporting units 112 and the base-end-side supporting units 113 hold the wafer W mainly by frictional force while supporting the wafer W from below in a state where the wafer W is spaced from the plate 111. The shape of the tip-side supporting unit 112 and the base-end-side supporting unit 113 is not particularly limited as long as they have a surface that comes into contact with the wafer W at least in the horizontal direction and the vertical direction.

The pressing driving unit 114 is a drive mechanism that linearly moves the pressing units 114a along the X axis direction by projecting the projection 114b and includes, for example, an air cylinder and the like. The shape of the pressing driving unit 114, the pressing unit 114a, and each component relating to the pressing driving unit 114 shown in FIG. 3 is an example and does not limit the shape thereof.

The pressing driving unit 114 and the pressing units 114a form a gripping mechanism that grips the wafer W together with the tip-side supporting units 112 described above.

Specifically, the pressing driving unit 114 causes the pressing units 114a to press the periphery of the wafer W by projecting the projection 114b, pushes out the wafer W in the positive direction of the X axis, and brings the periphery of the wafer W on the side opposite to the pressed side into contact with the sidewalls of the tip-side supporting units 112. Consequently, the wafer W is held and gripped between the pressing units 114a and the tip-side supporting units 112 by predetermined pressing force.

Moreover, the sensor 114c detects whether the wafer W is gripped by the pressing units 114a on the basis of the projection position of the projection 114b. Thus, the lower hand 11e is a gripping-type work holding unit that holds the wafer W by gripping it.

On the other hand, the upper hand 11b is a hand for conveying a high-temperature wafer W and is therefore a dropping-type work holding unit that holds the wafer W dropped from above mainly by frictional force different from the lower hand 11a that conveys a room-temperature wafer W.

Specifically, as shown in FIG. 4, the upper hand 11b includes a plate 111b, tip-side supporting units 112b, and base-end-side supporting units 113b. The plate 111b is a component corresponding to a base bottom portion or a base portion on which the wafer W is placed. The plate 111b is, for example, formed of a heat-resistant material, such as ceramic and fiber-reinforced plastic, in consideration of the fact that a high-temperature wafer W is placed thereon.

The tip-side supporting units 112b are arranged at the tip portion of the plate 111b. The base-end-side supporting units 113b are arranged at the base end portion of the plate 111b. Then, as shown in FIG. 4, the wafer W is placed between the tip-side supporting units 112b and the base-end-side supporting units 113b.

At this time, the tip-side supporting units 112b and the base-end-side supporting units 113b hold the wafer W mainly by frictional force while supporting the wafer W from below in a state where the wafer W is spaced from the plate 111b. The tip-side supporting units 112b and the base-end-side supporting units 113b are, for example, formed of a super heat-resistant material, such as polyimide resin, in consideration of the fact that they hold a high-temperature wafer W.

In this manner, because the upper hand 11b holds the wafer W mainly by frictional force, a high-temperature wafer W, which is easily warped or damaged, can be safely held.

When a high-temperature wafer W is placed on the plate 111b of the upper hand 11b, the plate 111b is heated by the heat from the wafer W and radiates radiation heat. For example, when the upper hand 11b and the lower hand 11a are brought into a positional relationship in which they are arranged vertically one over the other and are vertically close to each other, the radiation heat adversely affects the sensor 114c of the lower hand 11a and the like.

Thus, the upper hand 11b according to the first embodiment includes a heat insulating member (hereinafter, described as "heat insulating plate") 115 on the lower surface of the plate 111b. The heat insulating plate 115 is, for example, formed of a super heat-resistant material, such as polyimide resin.

In this manner, in the conveying robot 10, a plurality of hands, i.e., the lower hand 11a and the upper hand 11b, is provided on the tip side of the second arm 12e to be rotatable about the same rotation axis a3 and the lower hand 11a and the upper hand 11b each hold the wafer W on the upper surface thereof and conveys it.

Furthermore, in the conveying robot 10, the upper hand 11b, which is a high-temperature-work holding unit that conveys a high-temperature wafer W, is provided at a position farther from the second arm 12e than the lower hand 11a, which is a room-temperature-work holding unit that conveys a room-temperature wafer W. In this case, in the conveying robot 10, the heat insulating plate 115, which is a heat insulating member, is provided on the back side of the upper hand 11b.

Consequently, even if the upper hand 11b holding a high-temperature wafer W and the lower hand 11a are brought into a positional relationship in which they are arranged vertically one over the other and are vertically close to each other, it is possible to reduce the adverse effect of the radiation heat radiated from the plate 111b of the upper hand 11b on the lower hand 11a.

Figure 5:
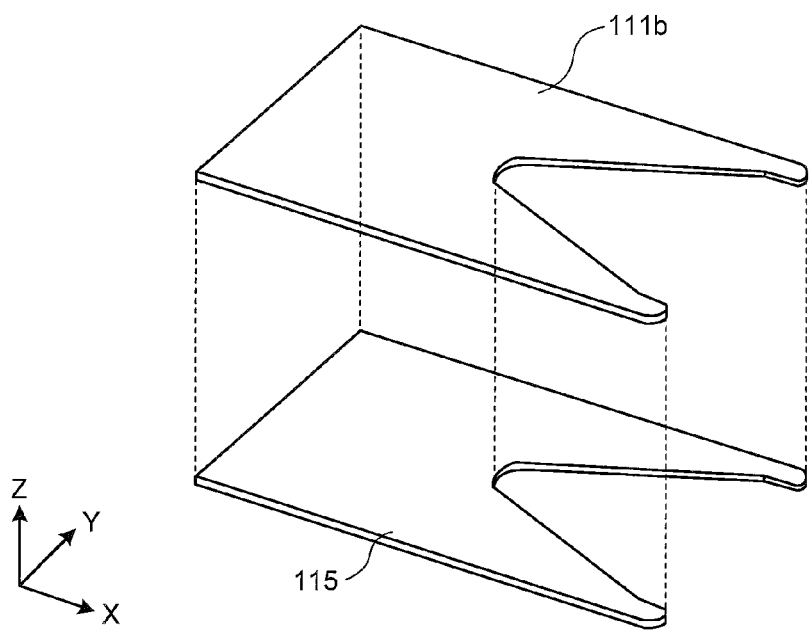
FIG. 5 is a schematic perspective view illustrating the shape of a heat insulating plate according to the first embodiment.

Next, the shape of the heat insulating plate 115 will be explained with reference to FIG. 5. FIG. 5 is a schematic perspective view illustrating the shape of the heat insulating plate 115 according to the first embodiment. FIG. 5 illustrates an exploded perspective view of the heat insulating plate 115 separated from the plate 111b in the negative direction of the Z axis.

As shown in FIG. 5, in the heat insulating plate 115, the surface opposed to the plate 111b has a shape the same as the plate 111b, and the heat insulating plate 115 is provided on the lower surface side of the plate 111b to overlap with the plate 111b in top view.

According to the heat insulating plate 115, the area necessary for blocking the radiation heat radiated to the lower hand 11a from the plate 111b can be minimized, therefore, the cost can be minimized.

Figure 6:
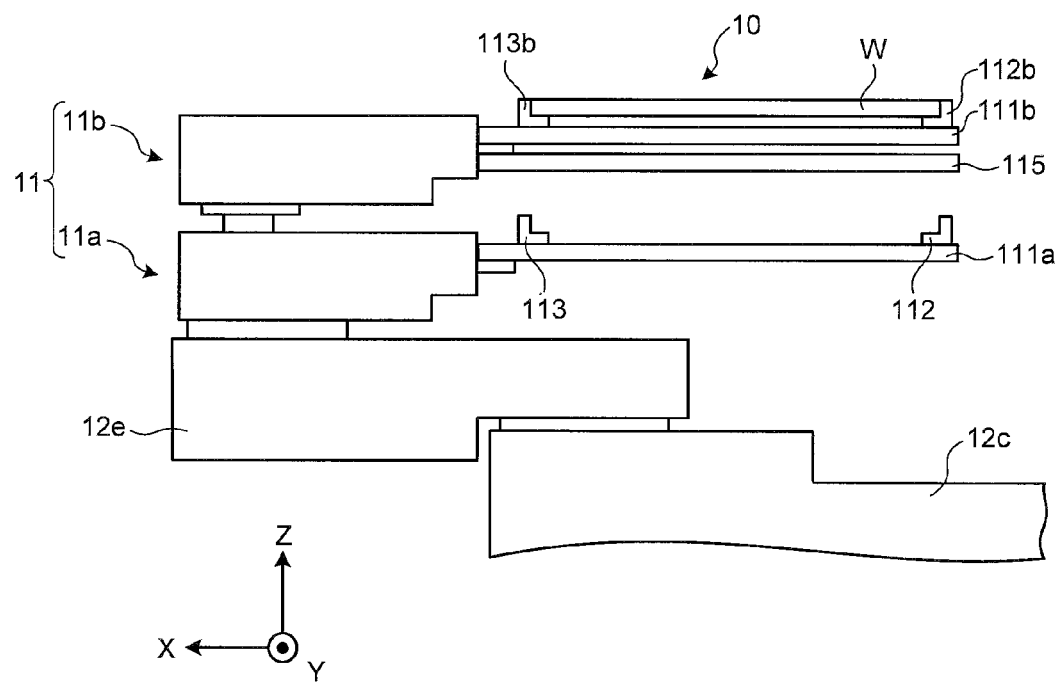
FIG. 6 is a schematic side view illustrating an example of a posture of the conveying robot according to the first embodiment.

Next, further operations and effects obtained by providing the heat insulating plate 115 will be explained with reference to FIG. 6. FIG. 6 is a schematic side view illustrating an example of a posture of the conveying robot 10 according to the first embodiment. FIG. 6 selectively illustrates the first arm 12c of the conveying robot 10 on the tip side of the middle part in the extending direction.

As shown in FIG. 6, in some cases, the conveying robot 10 takes a posture in which the tip portions of the first arm 12c and the second arm 12e are both directed to the positive direction of the X axis and the tip portions of the lower hand 11a and the upper hand 11b holding a high-temperature wafer W are both directed to the negative direction of the X axis.

In other words, in the conveying robot 10, the first arm 12c, the second arm 12e, the lower hand 11a, and the upper hand 11b are in some cases brought into a positional relationship in which they are overlapped in top view and are close to one another during conveying of a high-temperature wafer W by the upper hand 11b.

In such a case, as described above, although the drive mechanism, such as a motor, a pulley, and a belt, is provided in the first arm 12c and the second arm 12e, the heat insulating plate 115 is provided on the lower surface of the upper hand 11b, therefore, the drive mechanism can be protected from the radiation heat from the plate 111b.

Moreover, as shown in FIG. 6, the heat insulating plate 115 is spaced a predetermined interval from the lower surface of the plate 111b. Consequently, the heat insulating plate 115 can be prevented from being heated by directly coming into contact with the plate 111b. Therefore, the radiation heat radiated from the heat insulating plate 115 can be prevented from adversely affecting the lower hand 11a, the first arm 12c, and the second arm 12e.

The heat insulating member provided on the lower surface of the upper hand 11b is not limited to the heat insulating plate 115. In the following, a conveying robot 10a provided with a heat insulating member other than the heat insulating plate 115 will be explained with reference to FIG. 7.

FIG. 7 is a schematic side view of the conveying robot 10a that includes a heat insulating member other than the heat insulating plate 115 according to the first embodiment. FIG. 7 selectively illustrates the first arm 12c of the conveying robot 10a on the tip side of the middle part in the extending direction, and components the same as those shown in FIG. 6 are denoted by the same reference numerals.

As shown in FIG. 7, the conveying robot 10a has the same configuration as the conveying robot 10 shown in FIG. 6 except for the point that an upper hand 21b includes a heat insulating resin 215 coated on the lower surface of the plate 111b as a heat insulating member. For example, polyimide resin excellent in heat insulating property can be used as the heat insulating resin 215 to be a heat insulating member.

In this manner, the lower hand 11a, the first arm 12c, and the second arm 12e can be protected from the radiation heat radiated from the plate 111b of the upper hand 21b also by coating the lower surface of the plate 111b of the upper hand 21b with the heat insulating resin 215.

Moreover, a heat insulating member having the same shape as the plate 111b can be easily formed at low cost by using the heat insulating resin 215 coated on the lower surface of the plate 111b as a heat insulating member provided on the lower surface of the upper hand 21b.

In the above, an explanation is given of a case where a hand provided on the lower stage is for room temperature and a hand provided on the upper stage is for high temperature, however, a hand for high temperature may be provided on the lower stage side and a hand for low temperature may be provided on the upper stage side. In the following, a conveying robot 10b that is provided with a hand for high temperature on the lower stage side and a hand for low temperature on the upper stage side will be explained with reference to FIG. 8.

FIG. 8 is a schematic side view of the conveying robot 10b that is provided with a hand for high temperature on the lower stage side and a hand for low temperature on the upper stage side according to the first embodiment. FIG. 8 selectively illustrates the first arm 12c of the conveying robot 10b on the tip side of the middle part in the extending direction, and components the same as those shown in FIG. 6 are denoted by the same reference numerals.

As shown in FIG. 8, the conveying robot 10b has the same configuration as the conveying robot 10 shown in FIG. 6 except for the point that the conveying robot 10b includes a hand 31a for high temperature on the lower stage side and a hand 31b for room temperature on the upper stage side. Moreover, the hand 31a for high temperature has the same configuration as the upper hand 11b shown in FIG. 6 and includes a heat insulating plate 315a on the lower surface of a plate 311a.

Consequently, in the conveying robot 10b, when the hand 31a for high temperature holding a high-temperature wafer W and the first arm 12c and the second arm 12e are arranged vertically one over the other and are vertically close to each other, the first arm 12c and the second arm 12e can be protected from the radiation heat from the plate 311a by the heat insulating plate 315a.

On the other hand, the hand 31b for room temperature provided on the upper stage is different from the lower hand 11a shown in FIG. 6 in that the hand 31b includes a heat insulating plate 315b on the lower surface of a plate 311b.

Consequently, in the conveying robot 10b, when the hand 31a for high temperature holding a high-temperature wafer W and the hand 31b for room temperature are arranged vertically one over the other and are vertically close to each other, the hand 31b for room temperature can be protected from the radiation heat from the wafer W by the heat insulating plate 315b.

Moreover, in the conveying robot 10b, the hand 31a for high temperature can be attached to both the upper stage and the lower stage. With such a configuration, even when a high-temperature wafer W is held by any one of or both of the two hands 31a for high temperature, the first arm 12c and the second arm 12e can be protected from the radiation heat from the plate 311a by the heat insulating plate 315a. In the present embodiment, an explanation is given of a case where the heat insulating member is the heat insulating plates 315a and 315b, however, the heat insulating member may be the heat insulating resin 215 shown in FIG. 7.

As described above, the conveying robot according to the first embodiment includes a plurality of work holding units and a heat insulating member. The work holding units each hold a work to be conveyed on one surface and are arranged vertically one over the other in some cases during conveying of the works. The heat insulating member is provided on the other surface side of at least one of the work holding units.

Therefore, according to the conveying robot in the first embodiment, it is possible to reduce an adverse effect of the radiation heat radiated from a holding unit conveying a high-temperature substrate or the radiation heat radiated from the heated substrate during conveying on another holding unit.

In the first embodiment, an explanation is given of a case where the conveying robot is provided with two work holding units, however, the conveying robot may be provided with three or more work holding units. In this case, the heat insulating member is provided on the side opposite to the work holding surface of at least one work holding unit.

Consequently, when the high-temperature-work holding unit is provided with the heat insulating member, other work holding units whose work holding surface is close to the heat insulating member can be protected from the radiation heat from the high-temperature-work holding unit.

On the other hand, when the room-temperature-work holding unit is provided with the heat insulating member, even if a high-temperature work is held by other work holding units whose work holding surface is close to the heat insulating member, the room-temperature-work holding unit can be protected from the radiation heat from the high-temperature work.

Second Embodiment

Figure 9:
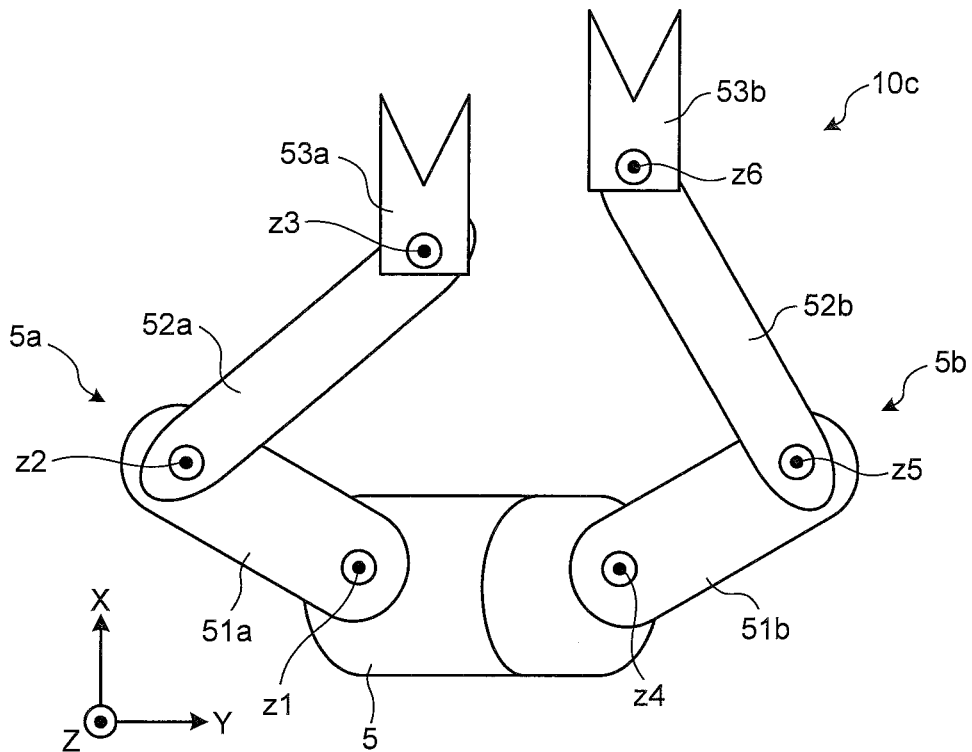
FIG. 9 and FIG. 10 are schematic top views of a conveying robot according to a second embodiment.
Figure 10:
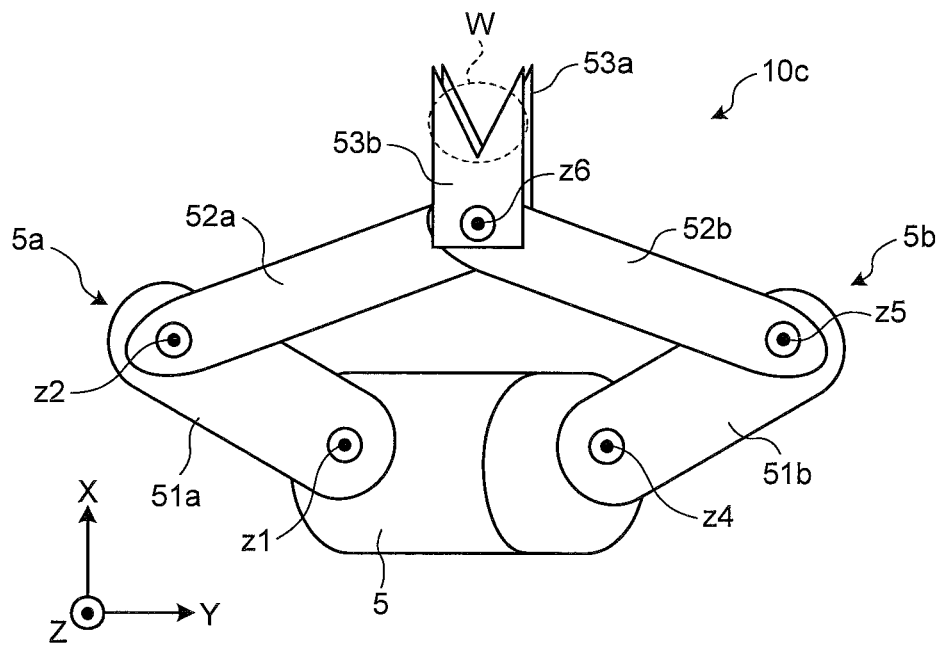

Next, a conveying robot 10c according to the second embodiment will be explained. FIG. 9 and FIG. 10 are schematic top views of the conveying robot 10c according to the second embodiment. As shown in FIG. 9, the conveying robot 10c includes a trunk 5, and a left arm unit 5a and a right arm unit 5b extending from the trunk 5.

The trunk 5 is a base unit of the conveying robot 10c fixed to the floor or the like and is formed such that the top surface on the positive direction side (hereinafter, described as "right side") of the Y axis is higher in the Z-axis direction than the top surface on the negative direction side (hereinafter, described as "left side") of the Y axis.

The left arm unit 5a includes a first arm 51a and a second arm 52a. The first arm 51a is such that the base end side is provided on the left side top surface of the trunk 5 to be rotatable about an axis z1 parallel to the Z axis as a rotation axis.

Moreover, the second arm 52a is such that the base end side is provided on the tip side of the first arm 51a to be rotatable about an axis z2 parallel to the Z axis as a rotation axis. Moreover, a work holding unit (hereinafter, described as "left hand") 53a is provided on the tip side of the second arm 52a to be rotatable about an axis z3 parallel to the Z axis as a rotation axis.

On the other hand, the right arm unit 5b includes a first arm 51b and a second arm 52b. The first arm 51b is such that the base end side is provided on the right side top surface of the trunk 5 to be rotatable about an axis z4 parallel to the Z axis as a rotation axis.

Moreover, a work holding unit (hereinafter, described as "right hand") 53b is provided on the tip side of the second arm 52b to be rotatable about an axis z6 parallel to the Z axis as a rotation axis. Moreover, the second arm 52b is such that the base end side is provided on the tip side of the first arm 51b to be rotatable about an axis z5 parallel to the Z axis as a rotation axis.

In the conveying robot 10c, the left hand 53a and the right hand 53b each hold the wafer W on one surface (in this embodiment, upper surface) and they convey the wafers W on the planes that are different in height in the Z-axis direction and are parallel to each other.

Therefore, in the conveying robot 10c, as shown in FIG. 10, the left hand 53a and the right hand 53b are arranged vertically one over the other and are vertically close to each other in some cases. In this embodiment, the right arm unit 5b is provided at a position higher in the Z-axis direction than the left arm unit 5a, therefore, the right hand 53b holding a high-temperature wafer W is located over the right hand 53b holding a room-temperature wafer W in some cases.

Thus, in the case where a room-temperature wafer W is conveyed by the left hand 53a and a high-temperature wafer W is conveyed by the right hand 53b, the left hand 53a is configured the same as the lower hand 11a shown in FIG. 6 and the right hand 53b is configured the same as the upper hand 11b shown in FIG. 6.

Consequently, even when the right hand 53b holding a high-temperature wafer W is located over the left hand 53a for room temperature, because the right hand 53b includes the heat insulating plate on the lower surface side, the left hand 53a can be protected from the radiation heat from the right hand 53b.

On the other hand, in the case where a high-temperature wafer W is conveyed by the left hand 53a and a room-temperature wafer W is conveyed by the right hand 53b, the left hand 53a is configured the same as the lower hand 31a shown in FIG. 8 and the right hand 53b is configured the same as the upper hand 31b shown in FIG. 8.

Consequently, even when the right hand 53b for room temperature is located over the left hand 53a holding a high-temperature wafer W, because the right hand 53b includes the heat insulating plate on the lower surface side, the right hand 53b can be protected from the radiation heat from the wafer W.

Even if the left hand 53a holding a high-temperature wafer W and the second arm 52a are arranged vertically one over the other, because the left hand 53a includes the heat insulating plate on the lower surface side, the second arm 52a can be protected from the radiation heat from the left hand 53a.

As described above, the work holding units of the conveying robot according to the second embodiment are provided on the tip sides of a plurality of arms extending from the same trunk, respectively, hold works on the upper surfaces thereof, and convey the works on the planes parallel to each other.

Furthermore, if the high-temperature-work holding unit that conveys a high-temperature work at a temperature above the room temperature is in some cases located over the room-temperature-work holding unit that conveys a room-temperature work, the heat insulating member is provided on the lower surface side of the high-temperature-work holding unit.

Therefore, according to the conveying robot in the second embodiment, when the high-temperature-work holding unit that conveys a high-temperature work at a temperature above the room temperature is located over the room-temperature-work holding unit, the room-temperature-work holding unit can be protected from the radiation heat from the high-temperature-work holding unit.

Moreover, if the room-temperature-work holding unit that conveys a room-temperature work is in some cases located over the high-temperature-work holding unit that conveys a high-temperature work at a temperature above the room temperature, the heat insulating member of the conveying robot according to the second embodiment is provided on the lower surface side of the room-temperature-work holding unit and the high-temperature-work holding unit.

Thus, according to the conveying robot in the second embodiment, when the room-temperature-work holding unit is located over the high-temperature-work holding unit, the room-temperature-work holding unit can be protected from the radiation heat from a high-temperature work. Furthermore, when the room-temperature-work holding unit and the arm are overlapped and are close to each other, the arm can be protected from the radiation heat from the high-temperature-work holding unit. In the above-described second embodiment, an explanation is given of a case where the number of arms provided in the conveying robot is two, however, the number of arms provided in the conveying robot may be three or more.

Moreover, in the first and second embodiments, an explanation is given of a case where each work holding unit holds a work on the upper surface side and the heat insulating member is provided on the lower surface side of at least any one of the work holding units, however, the work holding surface and the arrangement surface of the heat insulating member may be interchanged.

Specifically, the conveying robot may be configured such that each work holding unit holds a work on the lower side surface and the heat insulating member is provided on the upper surface side of at least any one of the work holding units. Even with this configuration, in a similar manner to the conveying robot according to the second embodiment, the room-temperature-work holding unit can be protected from the radiation heat from the high-temperature-work holding unit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A conveying robot comprising:
    a first work holder having a first supporter, a first plate, a first surface, and a second surface opposite to the first surface to hold a first work on the first surface;
    a second work holder having a second supporter, a second plate, a third surface, and a fourth surface opposite to the third surface to hold a second work on the third surface, the first work holder and the second work holder being vertically overlapped each other during conveying of the first work and the second work;
    a first heat insulator provided on the first supporter, the first heat insulator being rotatable together with the first plate; and
    a second heat insulator provided on the second supporter, the second heat insulator being rotatable together with the second plate,
    wherein the first supporter and the second supporter individually rotate about a same rotation axis,
    wherein the first heat insulator includes a first heat insulating plate spaced a predetermined interval from the second surface,
    wherein the second heat insulator includes a second insulating plate spaced a predetermined interval from the fourth surface.

2. The conveying robot according to claim 1,
    wherein the first heat insulating plate has a shape same as the second surface and is provided to overlap with the first work holder in top view,
    and wherein the second heat insulating plate has a shape same as the fourth surface and is provided to overlap with the second work holder in top view.

3. The conveying robot according to claim 2,
    wherein the first work holder and the second work holder are provided on a tip side of an arm to be rotatable about the same rotation axis,
    and wherein the second work holder that conveys the second work at a temperature above a room temperature is provided at a position closer to the arm than to the first work holder that conveys the first work at a room temperature.

4. The conveying robot according to claim 2, further comprising a first arm and a second arm,
    wherein the first work holder and the second work holder are provided on a tip side of the second arm,
    wherein the first work holder and the second work holder each convey the first work and the second work on planes parallel to each other,
    and wherein the second work holder that conveys the second work at a temperature above a room temperature is in some cases located below the first work holder that conveys the first work at a room temperature.

5. The conveying robot according to claim 1,
    wherein the first heat insulator includes a first heat insulating resin,
    and wherein the second heat insulator includes a second heat insulating resin.

6. The conveying robot according to claim 5,
    wherein the first work holder and the second work holder are provided on a tip side of an arm to be rotatable about the same rotation axis,
    and wherein the second work holder that conveys the second work at a temperature above a room temperature is provided at a position closer to the arm than to the first work holder that conveys the first work at a room temperature.

7. The conveying robot according to claim 5, further comprising a first arm and a second arm,
    wherein the first work holder and the second work holder are provided on a tip side of the second arm,
    wherein the first work holder and the second work holder each convey the first work and the second work on planes parallel to each other,
    and wherein the second work holder that conveys the second work at a temperature above a room temperature is in some cases located below the first work holder that conveys the first work at a room temperature.

8. The conveying robot according to claim 1,
    wherein the first work holder and the second work holder are provided on a tip side of an arm to be rotatable about the same rotation axis,
    and wherein the second work holder that conveys the second work at a temperature above a room temperature is provided at a position closer to the arm than to the first work holder that conveys the first work at a room temperature.

9. The conveying robot according to claim 1, further comprising a first arm and a second arm,
    wherein the first work holder and the second work holder are provided on a tip side of the second arm,
    wherein the first work holder and the second work holder each convey the first work and the second work on planes parallel to each other,
    and wherein the second work holder that conveys the second work at a temperature above a room temperature is in some cases located below the first work holder that conveys the first work at a room temperature.

10. The conveying robot according to claim 1, further comprising a first arm and a second arm,
    wherein the second heat insulator is configured to protect the first arm and the second arm from heat when the second plate is disposed above the first arm and the second arm.

11. A conveying robot comprising:
- a first work holding means having a first supporter, a first plate, a first surface, and a second surface opposite to the first surface for holding a first work on the first surface;
- a second work holding means having a second supporter, a second plate, a third surface, and a fourth surface opposite to the third surface for holding a second work on the third surface, the first work holding means and the second work holding means being vertically overlapped each other during conveying of the first work and the second work;
- a first heat insulating means that is provided on the first supporter, the first heat insulating means being rotatable together with the first plate; and
- a second heat insulating means that is provided on the second supporter, the second heat insulating means being rotatable together with the second plate,
- wherein the first supporter and the second supporter individually rotate about a same rotation axis,
- wherein the first heat insulating means includes a first heat insulating plate spaced a predetermined interval from the second surface,
- wherein the second heat insulating means includes a second insulating plate spaced a predetermined interval from the fourth surface.

12. The conveying robot according to claim 11, further comprising a first arm and a second arm,
- wherein the second heat insulating means is configured to protect the first arm and the second arm from heat when the second plate is disposed above the first arm and the second arm.

* * * * *